United States Patent
Yamamoto

(10) Patent No.: US 9,400,180 B2
(45) Date of Patent: Jul. 26, 2016

(54) ANGULAR VELOCITY SENSOR AND DETECTION ELEMENT USED THEREIN

(71) Applicant: Panasonic Corporation, Osaka (JP)

(72) Inventor: Kensaku Yamamoto, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 232 days.

(21) Appl. No.: 14/359,785

(22) PCT Filed: Nov. 16, 2012

(86) PCT No.: PCT/JP2012/007366
§ 371 (c)(1),
(2) Date: May 21, 2014

(87) PCT Pub. No.: WO2013/076942
PCT Pub. Date: May 30, 2013

(65) Prior Publication Data
US 2014/0283602 A1    Sep. 25, 2014

(30) Foreign Application Priority Data

Nov. 22, 2011 (JP) ................................. 2011-254557
Nov. 30, 2011 (JP) ................................. 2011-261399

(51) Int. Cl.
*G01C 19/56* (2012.01)
*G01C 19/5642* (2012.01)
(Continued)

(52) U.S. Cl.
CPC ........ *G01C 19/5642* (2013.01); *G01C 19/5621* (2013.01); *H01L 41/0805* (2013.01); *H01L 41/0933* (2013.01); *G01C 19/5747* (2013.01)

(58) Field of Classification Search
CPC .......................... G01C 19/5607; G01C 15/5621
USPC ........................................................ 73/504.12
See application file for complete search history.

(56) References Cited

U.S. PATENT DOCUMENTS

2010/0126270 A1    5/2010  Terada et al.
2011/0265564 A1   11/2011  Acar et al.
(Continued)

FOREIGN PATENT DOCUMENTS

JP    10-339640 A    12/1998
JP    2008-046056 A   2/2008
(Continued)

OTHER PUBLICATIONS

International Search Report for Application No. PCT/JP2012/007366 dated Dec. 11, 2012.
(Continued)

*Primary Examiner* — John Chapman, Jr.
(74) *Attorney, Agent, or Firm* — Pearne & Gordon LLP

(57) ABSTRACT

A detection element has: first and second fixed parts; first and second vertical beams each connected at first and second ends to the first and second fixed parts, respectively; a horizontal beam connected at first and second ends to centers of the first and second vertical beams, respectively; and four arms each connected at a first end to the horizontal beam and having a weight formed on a second end. The first vertical beam has a first slit formed nearer the first fixed part with respect to its center, a second slit formed nearer the second fixed part with respect to its center, and a coupling portion between these slits. The second vertical beam has a third slit formed nearer the first fixed part with respect to its center, a fourth slit formed nearer the second fixed part with respect to its center, and a coupling portion between these slits.

15 Claims, 14 Drawing Sheets

(51) Int. Cl.
*H01L 41/08* (2006.01)
*H01L 41/09* (2006.01)
*G01C 19/5621* (2012.01)
*G01C 19/5747* (2012.01)

(56) References Cited

U.S. PATENT DOCUMENTS

2011/0296914 A1   12/2011   Takahashi et al.
2012/0227489 A1   9/2012    Imanaka et al.

FOREIGN PATENT DOCUMENTS

| JP | 2009-128020 A | 6/2009 |
|----|---------------|--------|
| JP | 3169508 U     | 8/2011 |
| WO | 2009/044522 A1 | 4/2009 |
| WO | 2010/073576 A1 | 7/2010 |
| WO | 2011/086633 A1 | 7/2011 |
| WO | 2011/093077 A1 | 8/2011 |

OTHER PUBLICATIONS

The Extended European Search Report dated Apr. 1, 2015 for the related European Patent Application No. 12852311.5-1557/2784443.

Machine Translation of Domestic Re-Publication of PCT publication No. 2009-044522 published on Apr. 9, 2009.

Machine Translation of Publication of Japanese Utility Model Application No. 3169508 dated Aug. 4, 2011.

Machine Translation of Japanese Publication No. 2009-128020 published on Jun. 11, 2009.

ANGULAR VELOCITY SENSOR AND DETECTION ELEMENT USED THEREIN

TECHNICAL FIELD

The present invention relates to an angular velocity sensor used in mobile terminals, vehicles and the like, and a detection element used for the angular velocity sensor.

BACKGROUND ART

A conventional angular velocity sensor will be described with reference to a drawing. FIG. 14 is a perspective view of a detection element used for a conventional angular velocity sensor. Detection element 1 has a pair of fixed parts 16, horizontal beam 3, four arms 4, 5, 6 and 7, and weights 8, 17, 10 and 11. Horizontal beam 3 is connected between fixed parts 16. Arms 4, 5, 6 and 7 are connected at respective one ends thereof to horizontal beam 3. Weights 8, 17, and 11 are formed on the other ends of arms 4, 5, 6 and 7, respectively. Also, drive part 12 is formed on arm 4, monitor part 13 is formed on arm 5, and detection parts 14 and 15 are respectively formed on arms 6 and 7.

In this configuration, when an AC voltage is applied to drive part 12, arm 4 vibrates in an X-axis direction. Resonating with this vibration, arms 5, 6 and 7 also vibrate in the X-axis direction. Monitor part 13 detects a displacement of arm 5 in the X-axis direction. Detection parts 14 and 15 respectively detect displacements of arms 6 and 7 in a Y-axis direction caused by a Coriolis force generated when an angular velocity is applied to detection element 1. Detection element 1 detects an angular velocity around a Z-axis based on outputs of detection parts 14 and 15 (See, for example, PTL 1).

CITATION LIST

Patent Literature

PTL 1: Unexamined Japanese Patent Publication No. 2008-46056

SUMMARY OF THE INVENTION

An object of the present invention is to suppress transmission of an externally transmitted stress, and to suppress variations in detection sensitivity of a detection element.

A detection element according to the present invention has first and second fixed parts, first and second vertical beams, a horizontal beam, and four arms. The first and second vertical beams are connected at first ends thereof to the first fixed part, and at second ends thereof to the second fixed part. The horizontal beam is connected at a first end thereof to a center of the first vertical beam, and at a second end thereof to a center of the second vertical beam. The arms are connected at first ends thereof to the horizontal beam. Weights are formed on second ends of the arms. A drive part is provided on each of the arms. First to fourth detection parts configured to generate signals responsive to an angular velocity are provided on the first and second vertical beams. The first vertical beam has a first slit formed nearer the first fixed part with respect to the center thereof, a second slit formed nearer the second fixed part with respect to the center thereof, and a coupling portion between the first and second slits. The second vertical beam has a third slit formed nearer the first fixed part with respect to the center thereof, a fourth slit formed nearer the second fixed part with respect to the center thereof, and a coupling portion between the third and fourth slits.

With this configuration, it is possible to suppress an externally transmitted stress from being transmitted through the fixed parts to the horizontal beam, the arms and the weights. Accordingly, it is possible to suppress variations in detection sensitivity of the detection element.

DESCRIPTION OF EMBODIMENTS

Figure 1:
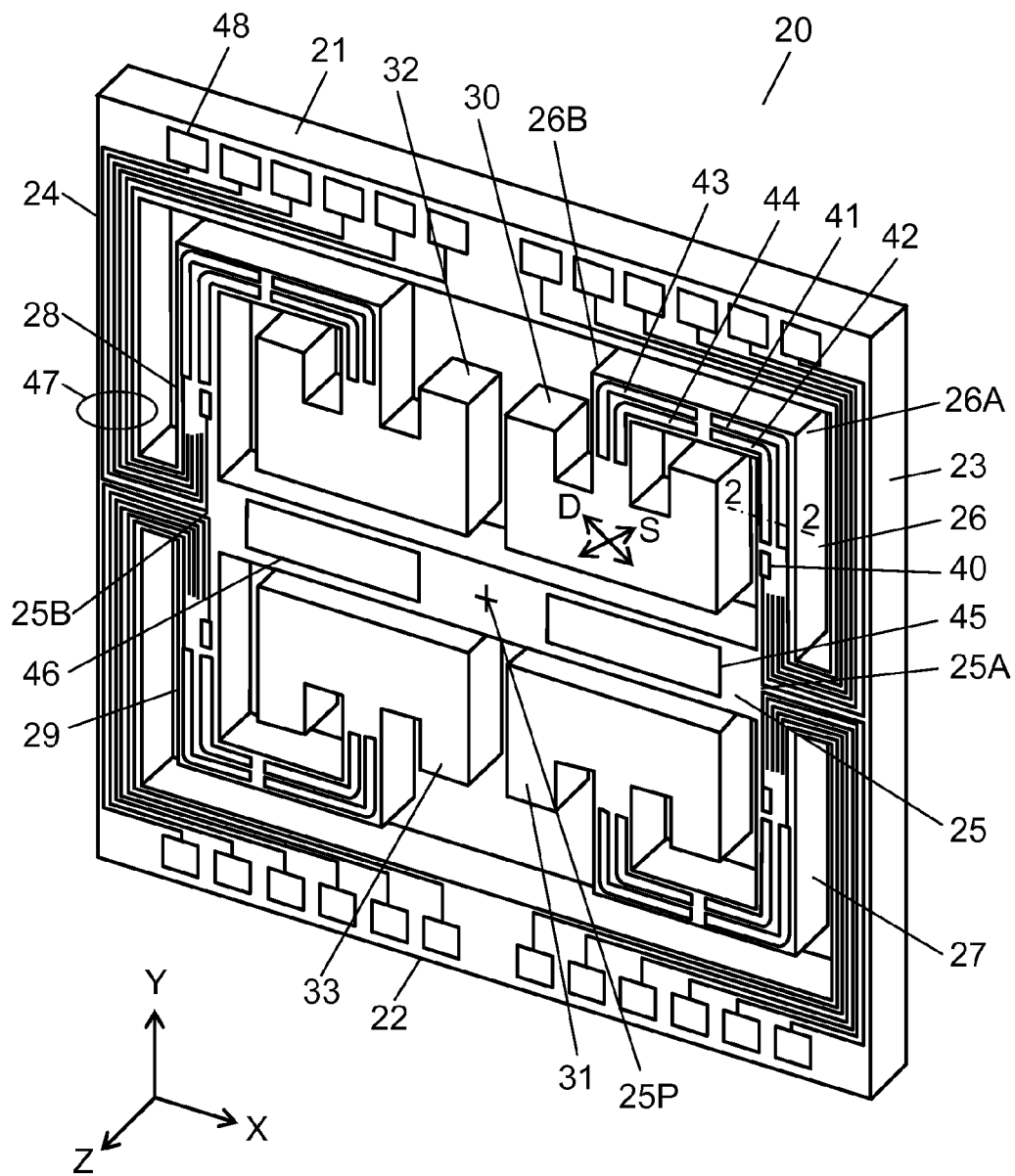
FIG. 1 is a top perspective view of a detection element for an angular velocity sensor according to a first embodiment of the present invention.

Before describing embodiments of the present invention, problems of the conventional angular velocity sensor will be explained. Recently, a multiple-axes angular velocity sensor capable of detecting angular velocities around a plurality of axes has been required. In detection element 1, detection parts 14 and 15 are formed on arms 6 and 7, respectively. If an additional detection part is provided on horizontal beam 3, an angular velocity around the Y-axis can be detected. However, wirings for connecting drive part 12 and the like to electrode pads on fixed part 16 are formed on the upper surface of horizontal beam 3. Therefore, even if a detection part is provided on horizontal beam 3, its electrode cannot be formed to have a large area, so that the sensitivity of detecting the angular velocity around the Y-axis cannot be made high. Further, in detection element 1, a stress caused at the time of mounting fixed part 16 on a user substrate and a stress transmitted from the user substrate are transmitted to horizontal beam 3 and arms 4, 5, 6 and 7 through fixed part 16. These externally transmitted stresses cause variations in the resonance frequency of the vibrator formed of horizontal beam 3, arms 4, 5, 6 and 7 and weights 8, 9, 10 and 11. As a result, the detection sensitivity of detection element 1 varies.

First Embodiment

Figure 2:
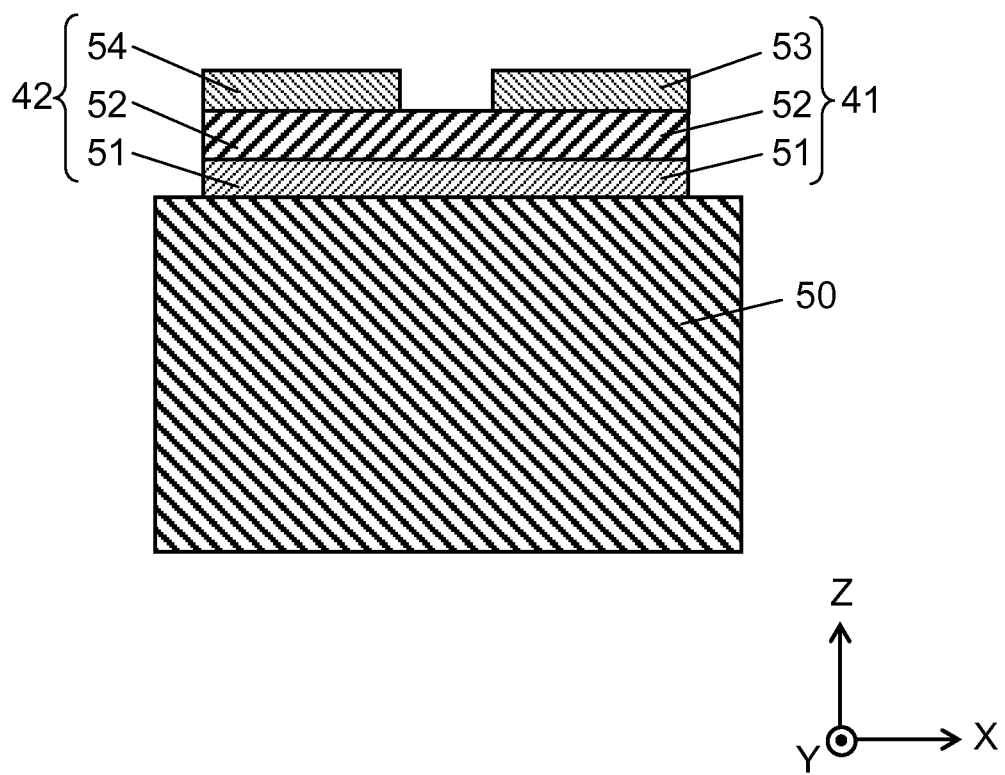
FIG. 2 is a sectional view along line 2-2 shown in FIG. 1.
Figure 3:
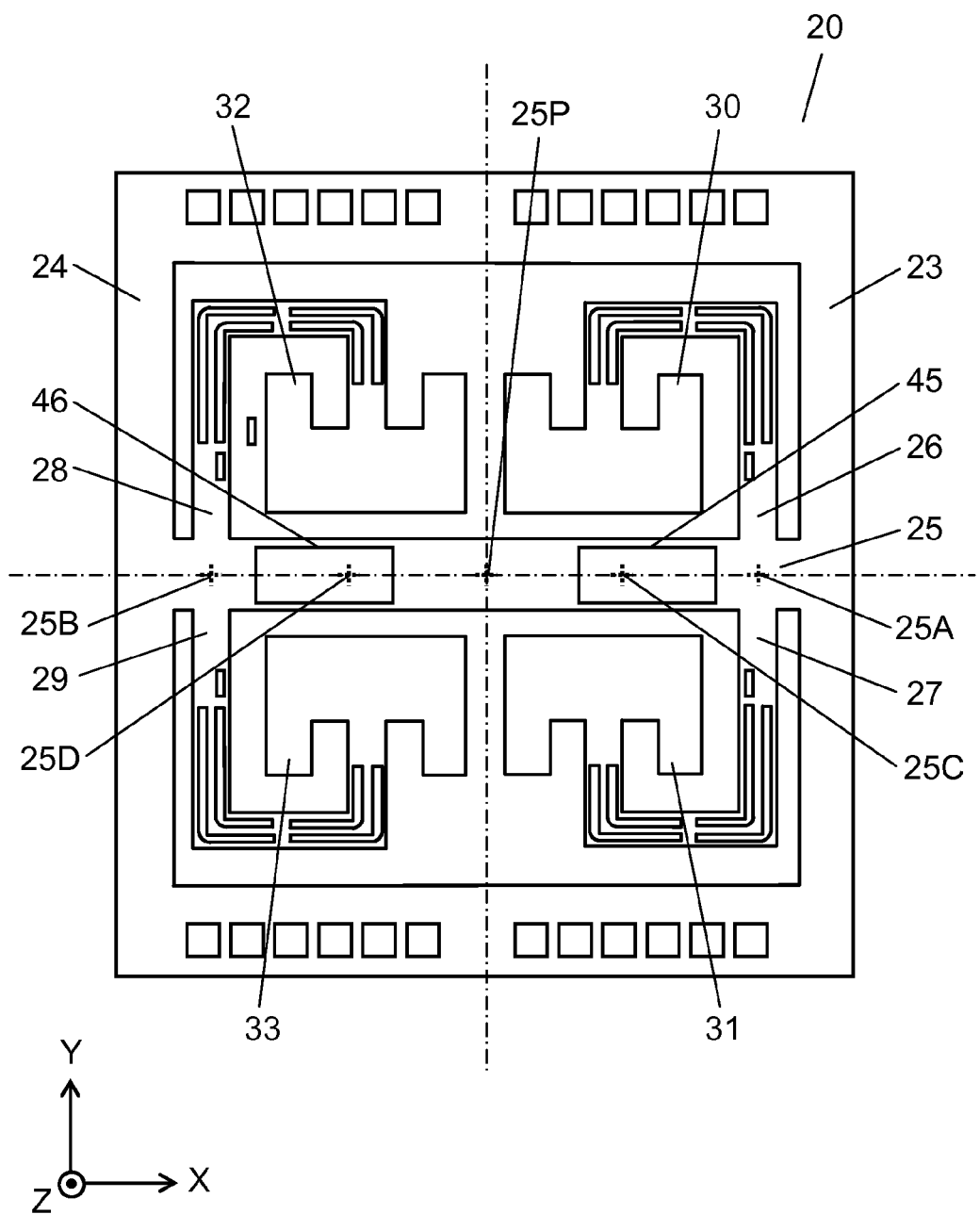
FIG. 3 is a top view of the detection element for an angular velocity sensor shown in FIG. 1.

Hereinafter, detection element 20 according to a first embodiment and an angular velocity sensor using it will be described with reference to the drawings. FIG. 1 is a top perspective view of detection element 20 according to the present embodiment. FIG. 2 is a sectional view along line 2-2 shown in FIG. 1. FIG. 3 is a top view of detection element 20.

Detection element 20 has fixed parts 21 and 22, vertical beams 23 and 24, horizontal beam 25, four arms 26, 27, 28 and 29, and weights 30, 31, 32 and 33. Each of vertical beams 23 and 24 is connected at a first end thereof to fixed part 21, and at a second end thereof to fixed part 22. Horizontal beam 25 is connected at a first end thereof to a center of vertical beam 23, and at a second end thereof to a center of vertical beam 24. Arms 26, 27, 28 and 29 are connected at respective first ends thereof to horizontal beam 25. Weights 30, 31, 32 and 33 are formed on second ends of arms 26, 27, 28 and 29, respectively.

The first end of arm 26 is connected to horizontal beam 25 on a positive side of an X-axis with respect center 25P of horizontal beam 25, and extends in a positive direction of a Y-axis. The first end of arm 27 is connected to horizontal beam 25 on the positive side of the X-axis with respect center 25P of horizontal beam 25, and extends in a negative direction of the Y-axis. In other words, arms 26 and 27 extend in opposite directions to each other from horizontal beam 25.

The first end of arm 28 is connected to horizontal beam 25 on a negative side of the X-axis with respect center 25P of horizontal beam 25, and extends in the positive direction of the Y-axis. The first end of arm 29 is connected to horizontal beam 25 on the negative side of the X-axis with respect center 25P of horizontal beam 25, and extends in the negative direction of the Y-axis. In other words, arms 28 and 29 extend in opposite directions to each other from horizontal beam 25.

Monitor part 40, drive parts 41 and 42, and detection parts 43 and 44 for detecting an angular velocity around a Z-axis are formed on each of arms 26 to 29. A plurality of electrode pads 48 are disposed on each of fixed parts 21 and 22, and electrically connected to monitor parts 40, drive parts 41 and 42 and detection parts 43 and 44, respectively, through wirings 47 formed so as to pass through vertical beams 23 and 24. Note that a part of the wirings between electrode pads 48 and monitor parts 40 are omitted in the drawing. Similarly, a part of the wirings between electrode pads 48 and detection parts 43 and 44 are also omitted in the drawing.

Detection parts 45 and 46 for detecting an angular velocity around the Y-axis are formed on an upper surface (a surface perpendicular to the Z-axis) of horizontal beam 25. Detection part 45 is disposed between center 25P and the position to which arms 26 and 27 are connected. Detection part 46 is disposed between center 25P and the position to which arms 28 and 29 are connected.

As described above, the first ends of arms 26 and 27 are connected to a position near an outer end of horizontal beam 25 at which horizontal beam 25 is connected to vertical beam 23. This position will hereinafter be referred to as first arm connecting portion 25A. Also, the first ends of arms 28 and 29 are connected to a position near an outer end of horizontal beam 25 at which horizontal beam 25 is connected to vertical beam 24. This position will hereinafter be referred to as second arm connecting portion 25B. Because of this structure, wirings 47 are not formed in the area between first arm connecting portion 25A and second arm connecting portion 25B. Accordingly, detection parts 45 and 46 can be formed without being affected by wirings 47.

Hereinafter, a detailed structure of detection element 20 and an angular velocity detecting method using detection element 20 will be described. As shown in FIG. 1, arm 26 has bent portions 26A and 26B, a straight portion connecting horizontal beam 25 and bent portion 26A, a straight portion connecting bent portion 26A and bent portion 26B, and a straight portion connecting bent portion 26B and weight 30. Weight 30 is disposed so as to face horizontal beam 25. Monitor part 40 is formed on the straight portion connecting horizontal beam 25 and bent portion 26A. Drive parts 41 and 42 are formed so as to extend from a position which is in the middle position of the straight portion connecting horizontal beam 25 and bent portion 26A and is nearer bent portion 26A with respect to monitor part 40, through bent portion 26A to a position in the middle position of the straight portion connecting bent portion 26A and bent portion 26B.

Detection parts 43 and 44 are formed so as to extend from a position which is in the middle position of the straight portion connecting bent portion 26A and bent portion 26B and is nearer bent portion 26B with respect to drive parts 41 and 42, through bent portion 26B to a position in the straight portion connecting bent portion 26B and weight 30. On each of the other arms 27, 28 and 29, the monitor part, the drive parts and the detection parts are formed in the same manner as above.

Detection part 45 is disposed between first arm connecting portion 25A and center 25P on horizontal beam 25. Detection part 46 is disposed between second arm connecting portion 25B and center 25P on horizontal beam 25.

As shown in FIG. 2, lower electrode 51 is formed on silicon substrate 50, piezoelectric thin film 52 is formed on lower electrode 51, and upper electrodes 53 and 54 are formed on piezoelectric thin film 52. Lower electrode 51, piezoelectric thin film 52 and upper electrode 53 form drive part 41. Lower electrode 51, piezoelectric thin film 52 and upper electrode 54 form drive part 42. Similarly, each of monitor part 40 and detection parts 43, 44, 45 and 46 is formed by a combination of a lower electrode, a piezoelectric thin film and an upper electrode.

Figure 4:
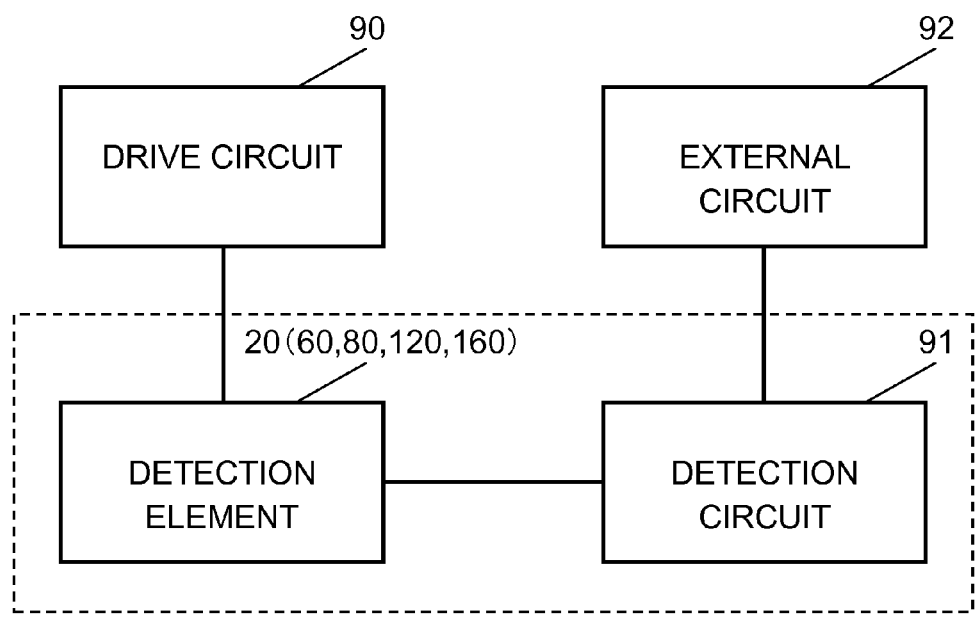
FIG. 4 is a block diagram of an angular velocity sensor according to embodiments of the present invention.

FIG. 4 is a block diagram of an angular velocity sensor according to embodiments of the present invention. Detection element 20 for detecting an angular velocity and detection circuit 91 form the angular velocity sensor. Incidentally, the angular velocity sensor may include drive circuit 90. Detection circuit 91 receives and processes signals outputted from detection element 20. The signals processed by detection circuit 91 are outputted to external circuit 92. Drive circuit 90 applies AC voltages to detection element 20. Application of drive signals opposite in phase to each other to drive parts 41 and 42, respectively, causes a drive vibration of detection element 20 along drive direction D on an XY plane.

When an angular velocity around the Z-axis is applied, weights 30 to 33 and arms 26 to 29 bend (deflect) along detection direction S due to a Coriolis force. The bends of arms 26 to 29 along detection direction S generate electric charges opposite in phase to each other at detection parts 43 and 44, respectively. Detection circuit 91 can detect the angular velocity around the Z-axis by detecting a difference between the electric charges generated at detection parts 43 and 44.

When an angular velocity around the Y-axis is applied, horizontal beam 25 bends in the Z-axis direction due to a Coriolis force. Electric charges opposite in phase to each other are generated at detection parts 45 and 46, respectively. Detection circuit 91 can detect the angular velocity around the Y-axis by detecting a difference between the electric charges generated at detection parts 45 and 46. The operation principle as described above is disclosed, for example, in International Publication No. 2010/073576.

Larger areas of detection parts 45 and 46 result in larger quantity of electric charges generated in response to a distortion of horizontal beam 25 in the Z-axis direction. This in turn improves the sensitivity of detecting the angular velocity around the Y-axis. In detection element 20, arms 26 to 29 are connected to the outer ends of horizontal beam 25, and no wiring is formed between first arm connecting portion 25A and center 25P and between second arm connecting portion 25B and center 25P. Accordingly, it is possible to increase the areas of detection parts 45 and 46, so that the sensitivity of detecting the angular velocity around the Y-axis can be improved. Meanwhile, detection element 20 is adhered to a package (not shown) or a semiconductor chip (not shown) with an adhesive applied to a lower surface of fixed part 21. Electrode pads 48 are electrically connected to the semiconductor chip with bonding wires or the like. An angular velocity detection signal is outputted from an electrode disposed on a lower part of the package.

Next, a preferable arrangement of detection parts 45 and 46 will be described with reference to FIG. 3. Note that wirings are omitted in FIG. 3.

Assuming that a central portion between first arm connecting portion 25A and center 25P of horizontal beam 25 is referred to as central portion 25C, it is preferable to form detection part 45 so that its center is situated nearer first arm connecting portion 25A with respect to central portion 25C. Similarly, assuming that a central portion between second arm connecting portion 25B and center 25P of horizontal beam 25 is referred to as central portion 25D, it is preferable to form detection part 46 so that its center is situated nearer second arm connecting portion 25B with respect to central portion 25D. The reason for this will be described below.

When an angular velocity is applied around the Y-axis, a Coriolis force in the Z-axis direction synchronized with the drive vibration is generated at each of arms 26 and 27 and weights 30 and 31. A Coriolis force opposite in phase to this Coriolis force is generated in the Z-axis direction at each of arms 28 and 29 and weights 32 and 33. Accordingly, forces in the Z-axis direction which are opposite in phase to each other are generated at first arm connecting portion 25A and second arm connecting portion 25B, respectively. Since the both ends of horizontal beam 25 are supported by vertical beams 23 and 24, horizontal beam 25 vibrates in the Z-axis direction in such a manner that center 25P becomes a node and portions in the vicinity of first arm connecting portion 25A and second arm connecting portion 25B become antinodes. Therefore, by forming detection parts 45 and 46 at positions close to the antinodes of the vibration, a distortion of horizontal beam 25 caused by the angular velocity around the Y-axis can be efficiently detected.

Incidentally, although a lower electrode, a piezoelectric thin film and upper electrodes are formed on a silicon substrate in detection element 20, silicon as the substrate material may be substituted by a non-piezoelectric material such as diamond, fused silica, alumina, GaAs and the like. Alternatively, the substrate may be formed by a piezoelectric material such as crystal, $LiTaO_3$, $LiNbO_3$ and the like.

Second Embodiment

Figure 5:
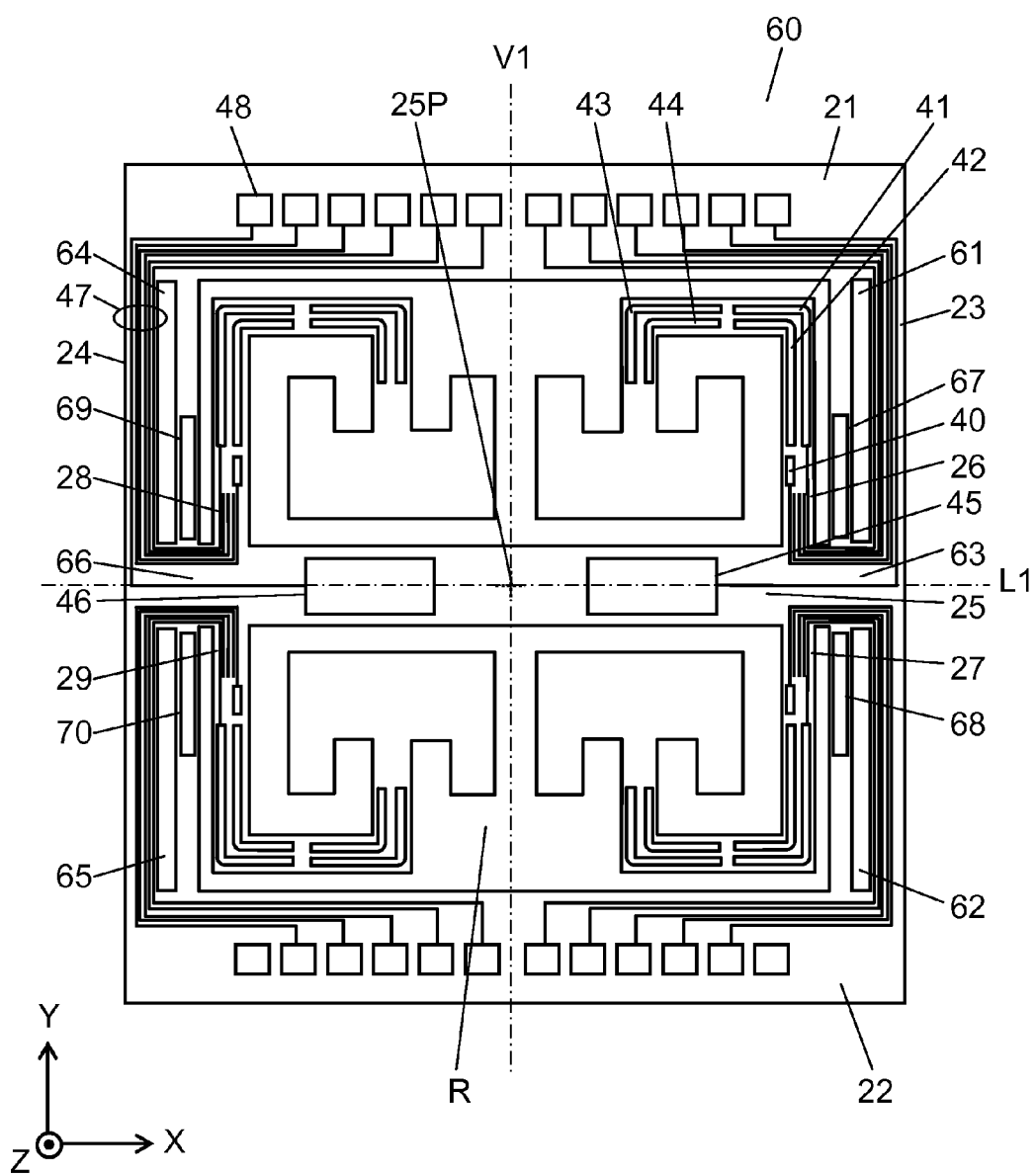
FIG. 5 is a top view of a detection element for an angular velocity sensor according to a second embodiment of the present invention.

FIG. 5 is a top view of detection element 60 according to a second embodiment. Hereinafter, the same structural components as those of the first embodiment are assigned with the same reference marks, and detailed description of them may occasionally be omitted.

Detection element 60 is able to detect angular velocities around three axes, namely the X-axis, the Y-axis and the Z-axis. Specifically, in detection element 60, similarly to detection element 20 of the first embodiment, monitor part 40, drive parts 41 and 42, and detection parts 43 and 44 for detecting an angular velocity around the Z-axis are formed on each of arms 26 to 29. Further, detection parts 45 and 46 for detecting an angular velocity around the Y-axis are formed on an upper surface (a surface perpendicular to the Z-axis) of horizontal beam 25. Furthermore, detection parts 67 to 70 for detecting an angular velocity around the X-axis are formed on vertical beams 23 and 24.

Vertical beam 23 is provided with slit 61 formed nearer fixed part 21 with respect to a center of vertical beam 23, slit 62 formed nearer fixed part 22 with respect to the center of vertical beam 23, and coupling portion 63 between slit 61 and slit 62. Also, vertical beam 24 is provided with slit 64 formed nearer fixed part 21 with respect to a center of vertical beam 24, slit 65 formed nearer fixed part 22 with respect to the center of vertical beam 24, and coupling portion 66 between slit 64 and slit 65.

As described above, detection parts 67 to 70 for detecting an angular velocity around the X-axis are formed on vertical beams 23 and 24. Specifically, assuming that an area surrounded by fixed parts 21 and 22 and vertical beams 23 and 24 is referred to as hollow area R, vertical beam 23 is provided with detection part 67 formed between slit 61 and hollow area R, and with detection part 68 formed between slit 62 and hollow area R. Also, vertical beam 24 is provided with detection part 69 formed between slit 64 and hollow area R, and with detection part 70 formed between slit 65 and hollow area R.

In this configuration, when an angular velocity around the X-axis is applied, vertical beams 23 and 24 bend in the Z-axis direction due to a Coriolis force. Electric charges which are the same in phase with each other are generated at detection parts 67 and 69, and electric charges which are opposite in phase to the above-mentioned electric charges are generated at detection parts 68 and 70. Detection circuit 91 shown in FIG. 4 can detect the angular velocity around the X-axis by detecting a difference between an added value of the electric charges generated at detection parts 67 and 69 and an added value of the electric charges generated at detection parts 68 and 70.

Wirings 47 are formed so as to pass through coupling portion 63 or 66. Specifically, wirings 47 electrically connecting the electrodes formed on arm 26 to electrode pads 48 formed on fixed part 21 pass through coupling portion 63, and then pass vertical beam 23 through the outer area than slit 61. Wirings 47 electrically connecting the electrodes formed on arm 27 to electrode pads 48 formed on fixed part 22 pass through coupling portion 63, and then pass vertical beam 23 through the outer area than slit 62. Wirings 47 electrically connecting the electrodes formed on arm 28 to electrode pads 48 formed on fixed part 21 pass through coupling portion 66, and then pass vertical beam 24 through the outer area than slit 64. Wirings 47 electrically connecting the electrodes formed on arm 29 to electrode pads 48 formed on fixed part 22 pass through coupling portion 66, and then pass vertical beam 24 through the outer area than slit 65.

As described above, in detection element 60 which is able to detect angular velocities around the three axes, respectively, slits 61, 62, 64 and 65 are formed so as to separate detection parts 67 to 70 from wirings 47. With this structure, it is possible to reduce influences of noises from wirings 47 on detection parts 67 to 70.

Third Embodiment

Figure 6:
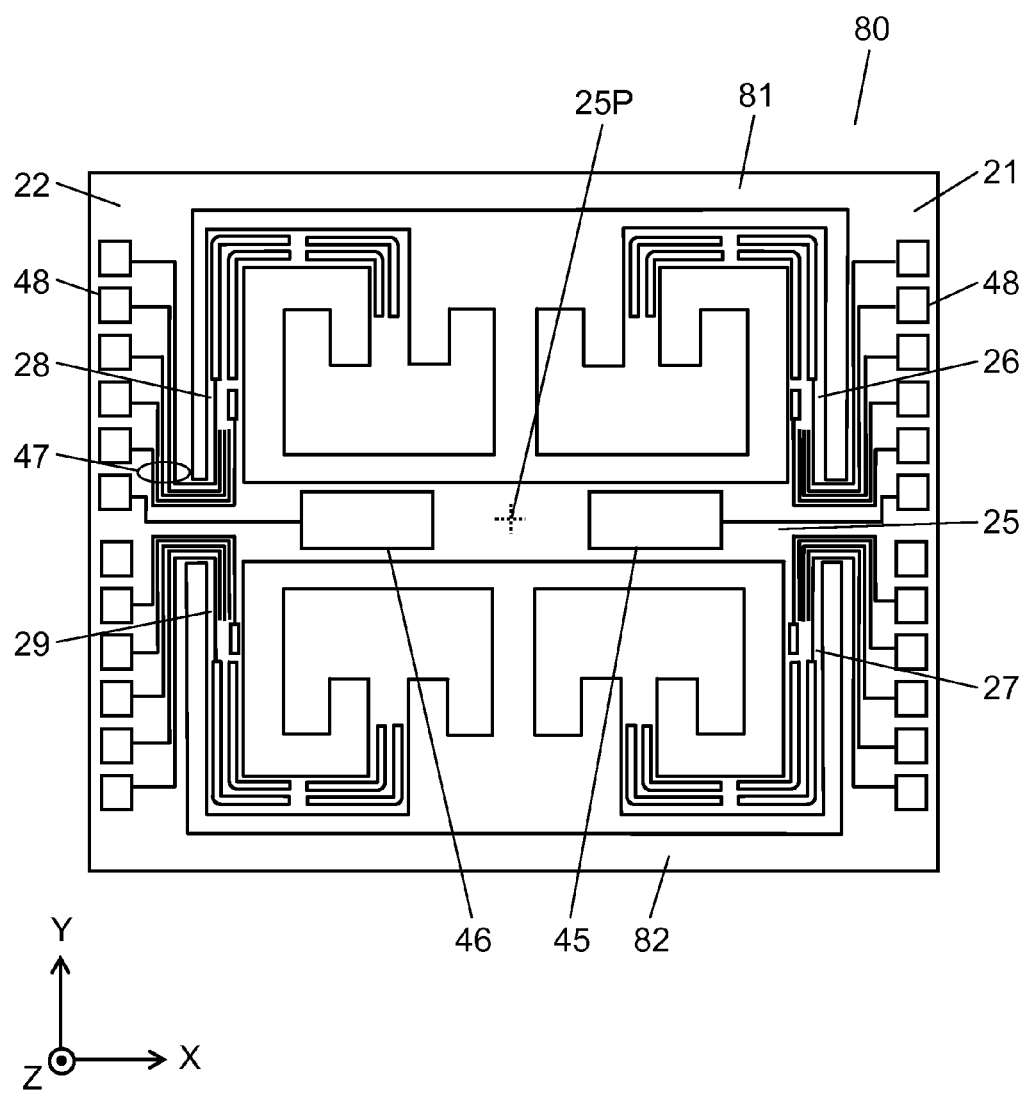
FIG. 6 is a top view of a detection element for an angular velocity sensor according to a third embodiment of the present invention.

FIG. 6 is a top view of detection element 80 according to a third embodiment. Hereinafter, the same structural components as those of the first embodiment are assigned with the same reference marks, and detailed description of them may occasionally be omitted.

In detection element 80, fixed parts 21 and 22 are disposed in parallel to the Y-axis. This point is different from detection element 20 of the first embodiment. Horizontal beam 25 is connected at a first end thereof to fixed part 21, and at a second end thereof to fixed part 22. Both ends of fixed parts 21 and 22 are connected by beams 81 and 82. Beams 81 and 82 can be used as stoppers for suppressing excessive amplitude of vibration of arms 26 to 29 caused by shock or the like.

First ends of arms 26 and 27 are connected to a position between detection part 45 and fixed part 21, and first ends of arms 28 and 29 are connected to a position between detection part 46 and fixed part 22. Accordingly, each of detection parts 45 and 46 can be formed to have a large area on horizontal beam 25 without being restricted by wirings 47, so that the sensitivity of detecting the angular velocity around the Y-axis can be improved.

Fourth Embodiment

Figure 7:
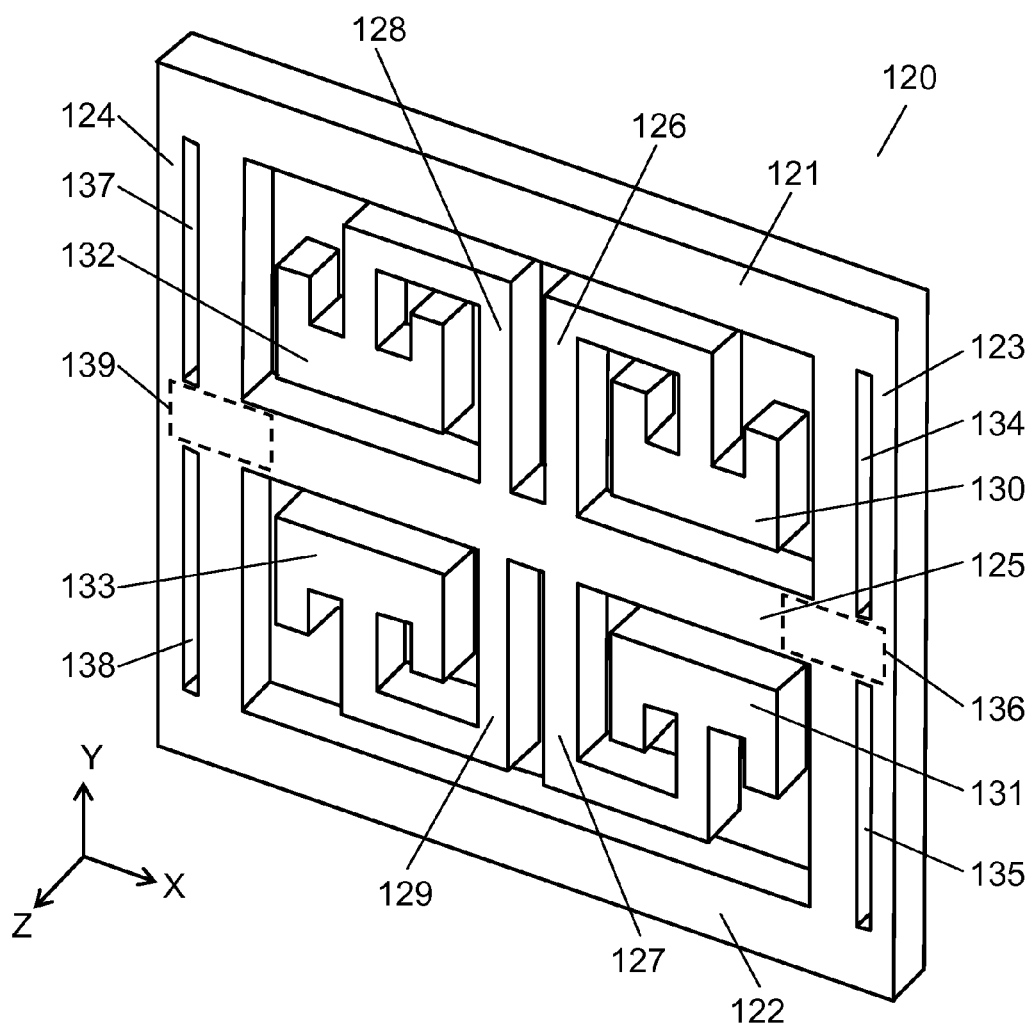
FIG. 7 is a perspective view of a detection element according to a fourth embodiment.
Figure 8:
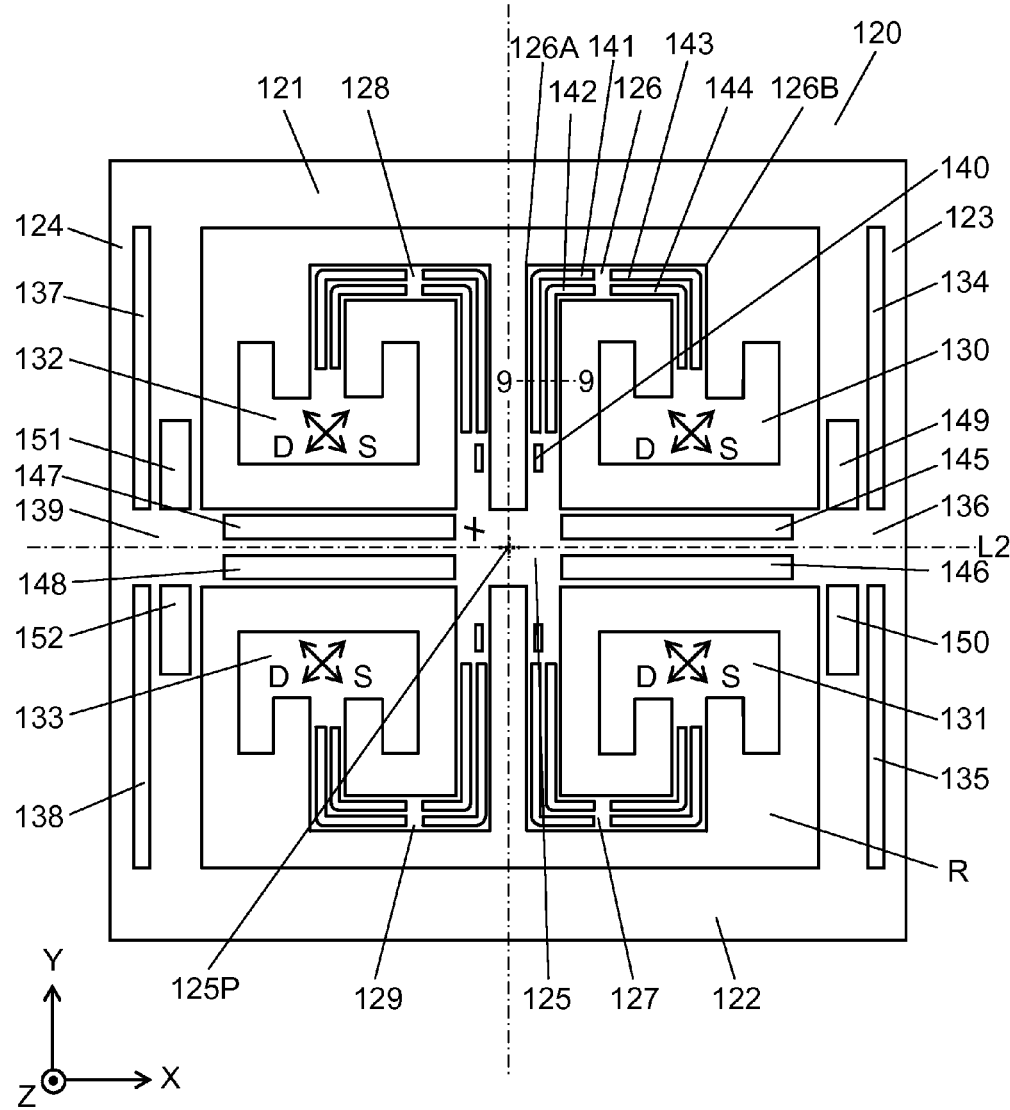
FIG. 8 is a top view showing an electrode arrangement of the detection element shown in FIG. 7.
Figure 9:
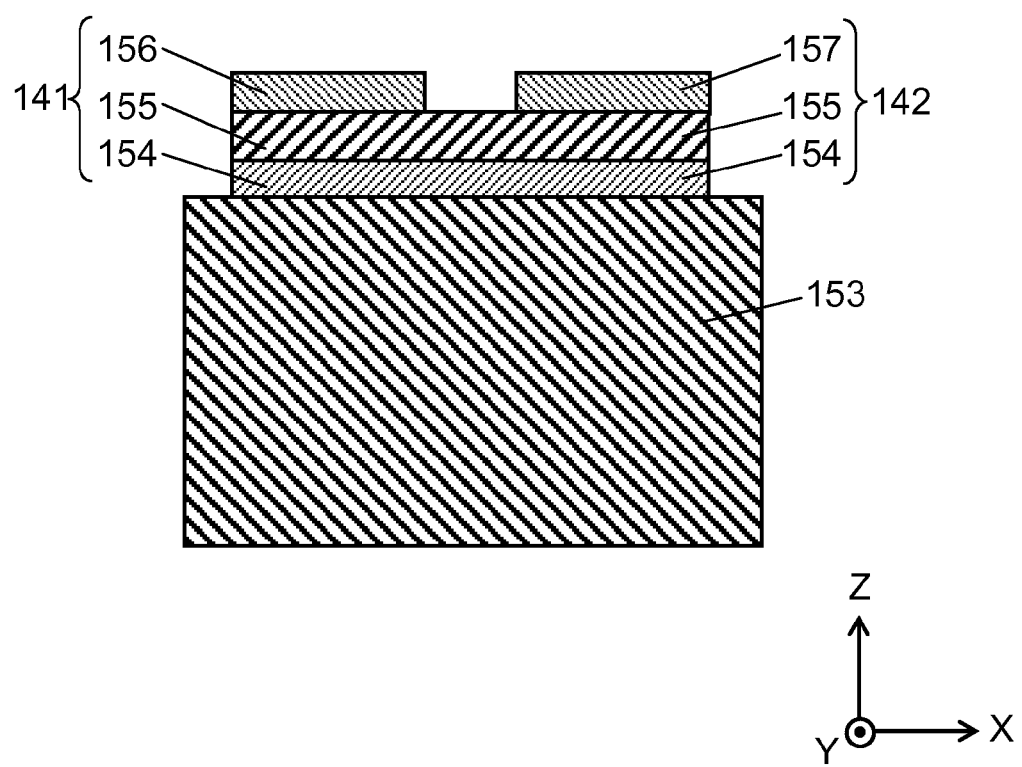
FIG. 9 is a sectional view along line 9-9 shown in FIG. 8.

Hereinafter, detection element 120 of a fourth embodiment will be described with reference to the drawings. FIG. 7 is a perspective view of detection element 120. FIG. 8 is a top view showing an electrode arrangement of detection element 120, and FIG. 9 is a sectional view along line 9-9 shown in FIG. 8.

Detection element 120 has fixed parts 121 and 122, vertical beams 123 and 124, horizontal beam 125, and arms 126, 127, 128 and 129. Each of vertical beams 123 and 124 has a first end connected to fixed part 121, and a second end connected to fixed part 122. Horizontal beam 125 is connected at a first end thereof to a center of vertical beam 123, and at a second end thereof to a center of vertical beam 124. Arms 126, 127, 128 and 129 are connected at first ends thereof to horizontal beam 125, and have weights 130, 131, 132 and 133 respectively formed on second ends thereof.

Vertical beam 123 has slit 134 formed nearer fixed part 121 with respect to the center thereof connected to horizontal beam 125, slit 135 formed nearer fixed part 122 with respect to the center, and coupling portion 136 between slit 134 and slit 135. In other words, coupling portion 136 is disposed at the center of vertical beam 123 or in the vicinity of the center.

Vertical beam 124 has slit 137 formed nearer fixed part 121 with respect to the center thereof connected to horizontal beam 125, slit 138 formed nearer fixed part 122 with respect to the center, and coupling portion 139 between slit 137 and slit 138. In other words, coupling portion 139 is disposed at the center of vertical beam 124 or in the vicinity of the center.

In the manner as described above, slits 134, 135, 137 and 138 are formed on vertical beams 123 and 124, respectively. Accordingly, it is possible to suppress stresses transmitted from outside through fixed parts 121 and 122 from being transmitted to horizontal beam 125, arms 126 to 129 and weights 130 to 133. In other words, this is the same effect as that of the second embodiment.

In detection element 60 shown in FIG. 5, arm 26 and arm 27 are line-symmetrical with respect to center axis L1 of horizontal beam 25 in the direction in which horizontal beam 25 extends between vertical beam 23 and vertical beam 24. Arm 28 and arm 29 are also line-symmetrical with respect to center axis L1. Further, arm 26 and arm 28 are line-symmetrical with respect to orthogonal axis V1 which is perpendicular to center axis L1. The first ends of arms 26 and 27 are connected to a position closer to vertical beam 23 than to center 25P of horizontal beam 25, and the first ends of arms 28 and 29 are connected to a position closer to vertical beam 24 than to center 25P.

On the other hand, in detection element 120 shown in FIG. 7 and FIG. 8, aims 126 and 127 are line-symmetrical with respect to center axis L2 of horizontal beam 125 in the direction in which horizontal beam 125 extends between vertical beam 123 and vertical beam 124. Aims 128 and 129 are also line-symmetrical with respect to center axis L2. Arms 126 and 128 are line-symmetrical with respect to orthogonal axis V2 which is perpendicular to center axis L2. Further, the first ends of arms 126 and 127 are connected to a position closer to center 125P of horizontal beam 125 than to vertical beam 123, and the first ends of arms 128 and 129 are connected to a position closer to center 125P than to vertical beam 124. As described above, the slits provided on the vertical beams are effective regardless of the directions, the connecting directions and the connecting positions, of the aims with respect to the horizontal beam.

Next, a method of detecting an angular velocity using detection element 120 will be described. As shown in FIG. 8, arm 126 has two bent portions 126A and 126B, thus arm 126 has a straight portion connecting horizontal beam 125 and bent portion 126A, a straight portion connecting bent portion 126A and bent portion 126B, and a straight portion connecting bent portion 126B and weight 130. Weight 130 is disposed so as to face horizontal beam 125. Monitor part 140 is formed on the straight portion connecting horizontal beam 125 and bent portion 126A. Drive parts 141 and 142 are formed so as to extend from a position which is in the middle of the straight portion connecting horizontal beam 125 and bent portion 126A and is nearer bent portion 126A with respect to monitor part 140, through bent portion 126A to a middle position of the straight portion connecting bent portion 126A and bent portion 126B.

Detection parts 143 and 144 for detecting an angular velocity around the Z-axis are formed so as to extend from a position which is in the middle position of the straight portion connecting bent portion 126A and bent portion 126B and is nearer bent portion 126B with respect to drive parts 141 and 142, through bent portion 126B to a middle position of the straight portion connecting bent portion 126B and weight 130. The other arms 127, 128 and 129 are also provided with the monitor parts, the drive parts and the detection parts formed in the same way as above.

Detection parts 145, 146, 147 and 148 for detecting an angular velocity around the Y-axis are formed on an upper surface of horizontal beam 125 so as to be symmetrical with respect to the X-axis or the Y-axis, or axis L2 or axis V2. More specifically, assuming that center 125P is an origin, detection part 145 is formed on the positive side of the X-axis and the positive side of the Y-axis, and detection part 146 is formed on the positive side of the X-axis and the negative side of the Y-axis. Also, detection part 147 is formed on the negative side of the X-axis and the positive side of the Y-axis, and detection part 148 is formed on the negative side of the X-axis and the negative side of the Y-axis.

First detection part 149, second detection part 150, third detection part 151 and fourth detection part 152 for detecting an angular velocity around the X-axis are formed on upper surfaces of vertical beams 123 and 124 so as to be symmetrical with respect to the X-axis or the Y-axis. More specifically, assuming that an area surrounded by fixed parts 121 and 122 and vertical beams 123 and 124 is referred to as hollow area R, first detection part 149 is formed between slit 134 and hollow area R, and second detection part 150 is formed between slit 135 and hollow area R. Also, third detection part 151 is formed between slit 137 and hollow area R, and fourth detection part 152 is formed between slit 138 and hollow area R.

As shown in FIG. 9, lower electrode 154 is formed on silicon substrate 153, piezoelectric thin film 155 is formed on lower electrode 154, and upper electrodes 156 and 157 are formed on piezoelectric thin film 155. Lower electrode 154, piezoelectric thin film 155 and upper electrode 156 form drive part 141. Lower electrode 154, piezoelectric thin film 155 and upper electrode 157 form drive part 142. Similarly, each of monitor part 140, detection parts 143 to 148, first detection part 149, second detection part 150, third detection part 151 and fourth detection part 152 is formed by a combination of a lower electrode, a piezoelectric thin film and an upper electrode. In other words, the configurations of the drive parts, the detection parts and the monitor parts are the same as those of the first to third embodiments.

Application of drive signals opposite in phase to each other to drive parts 141 and 142, respectively, from drive circuit 90 shown in FIG. 4 causes a drive vibration of detection element 120 in drive direction D on the XY plane.

When an angular velocity around the Z-axis is applied, weights 130 to 133 and arms 126 to 129 bend along detection direction S due to a Coriolis force. Electric charges opposite in phase to each other are generated at piezoelectric thin films 155 of detection parts 143 and 144, respectively, by the bends of arms 126 to 129 in detection direction S. Detection circuit 91 shown in FIG. 4 can detect the angular velocity around the Z-axis by detecting a difference between the electric charges generated at detection parts 143 and 144.

When an angular velocity around the Y-axis is applied, horizontal beam 125 bends in the Z-axis direction due to a Coriolis force. Electric charges with a same phase are generated at detection parts 145 and 146, and electric charges opposite in phase to the above-mentioned electric charges are generated at detection parts 147 and 148. Detection circuit 91 shown in FIG. 4 can detect the angular velocity around the Y-axis by detecting a difference between an added value of the electric charges generated at detection parts 145 and 146 and an added value of the electric charges generated at detection parts 147 and 148.

When an angular velocity around the X-axis is applied, vertical beams 123 and 124 bend in the Z-axis direction due to a Coriolis force. Electric charges with a same phase are generated at first detection part 149 and third detection part 151, and electric charges opposite in phase to the above-mentioned electric charges are generated at second detection part 150 and fourth detection part 152. Detection circuit 91 shown in FIG. 4 can detect the angular velocity around the X-axis by detecting a difference between an added value of the electric charges generated at first detection part 149 and third detection part 151 and an added value of the electric charges generated at second detection part 150 and fourth detection part 152.

In other words, the principle of detecting the angular velocity around each axis in detection element 120 is almost the same as that in detection element 60 according to the second embodiment. In this manner, each of the detection parts outputs a detection signal responsive to an angular velocity applied to detection element 120 around a respective axis.

Detection circuit 91 processes signals from the detection parts to detect an angular velocity around each axis.

Figure 10:
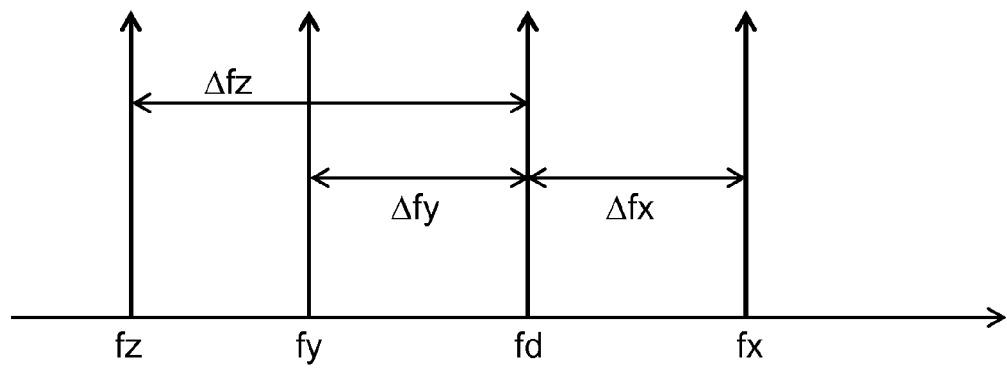
FIG. 10 is a diagram showing relationships between a drive vibration frequency and detection vibration frequencies of the detection element shown in FIG. 7.

FIG. 10 shows relationships between drive vibration frequency fd and detection vibration frequencies fx, fy and fz. When drive voltages which are opposite in phase to each other are applied from drive circuit 90 shown in FIG. 4 to drive parts 141 and 142, respectively, weights 130 to 133 and arms 126 to 129 cause drive vibrations at drive vibration frequency fd. When an angular velocity around the Z-axis is applied, weights 130 to 133 and arms 126 to 129 cause detection vibrations at detection vibration frequency fz. When an angular velocity around the Y-axis is applied, horizontal beam 25 causes a detection vibration at detection vibration frequency fy. When an angular velocity around the X-axis is applied, vertical beams 123 and 124 cause detection vibrations at detection vibration frequency fx.

The sensitivity of detecting the angular velocity around the Z-axis depends on difference Δfz between drive vibration frequency fd and detection vibration frequency fz, so that the sensitivity of detecting the angular velocity around the Z-axis increases as Δfz decreases. Similarly, the sensitivity of detecting the angular velocity around the Y-axis depends on difference Δfy between drive vibration frequency fd and detection vibration frequency fy, and the sensitivity of detecting the angular velocity around the X-axis depends on difference Δfx between drive vibration frequency fd and detection vibration frequency fx. Accordingly, variations in drive vibration frequency fd or detection vibration frequency fx, fy or fz cause variations in the sensitivities of detecting the angular velocities.

In detection element 120, slits 134, 135, 137 and 138 are provided on vertical beams 123 and 124, respectively. Therefore, it is possible to suppress a stress transmitted from outside through fixed parts 121 and 122 from being transmitted through fixed parts 121 and 122 to horizontal beam 125, arms 126 to 129 and weights 130 to 133. Consequently, variations in the detection sensitivities of detection element 120 can be suppressed.

Meanwhile, it is preferable, as shown in FIG. 8, to dispose coupling portions 136 and 139 and horizontal beam 125 on one straight line. Similarly to FIG. 5, a plurality of electrode pads (not shown) are disposed on fixed parts 121 and 122, and wirings (not shown) are formed on the upper surface of detection element 120 electrically connecting these electrode pads to monitor part 140, drive parts 141 and 142 and detection parts 143 to 148. By disposing coupling portions 136 and 139 and horizontal beam 125 on one straight line, it is possible to form these wirings on outer areas of vertical beams 123 and 124 through coupling portions 136 and 139. Accordingly, first detection part 149 to fourth detection part 152 are separated through slits 134 to 137 from the wirings formed on the outer areas of vertical beams 123 and 124. Consequently, it is possible to prevent unwanted signal components from being superposed to first detection part 149 to fourth detection part 152.

Incidentally, in detection element 120, each part is configured by a silicon substrate, and layers formed thereon including a lower electrode, a piezoelectric thin film and upper electrodes. However, similarly to the other embodiments, silicon as the substrate material may be substituted by a non-piezoelectric material such as diamond, fused silica, alumina, GaAs and the like. Alternatively, the substrate may be formed by a piezoelectric material such as crystal, LiTaO$_3$, LiNbO$_3$ and the like.

Fifth Embodiment

Figure 11:
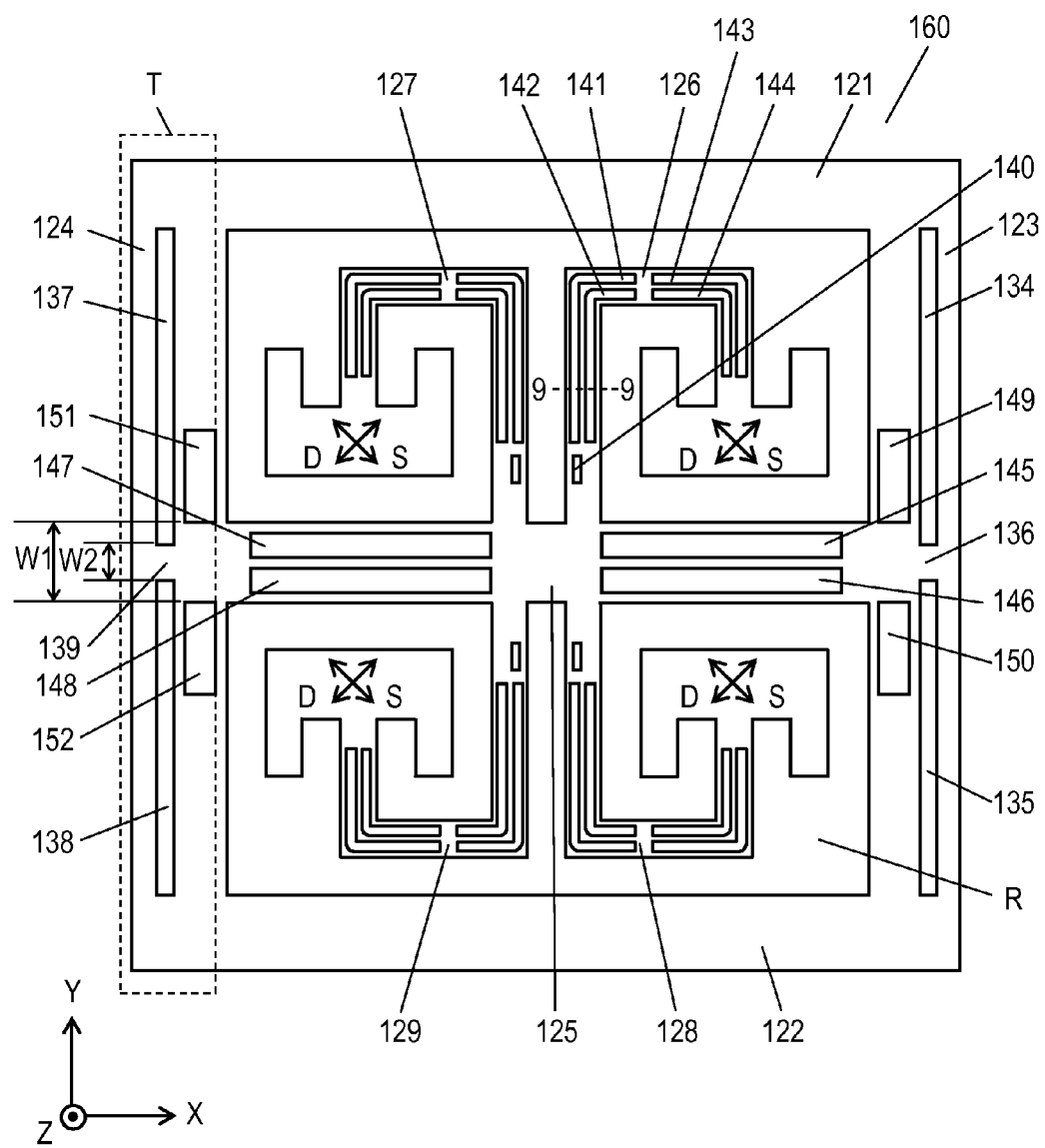
FIG. 11 is a top view of a detection element according to a fifth embodiment.

FIG. 11 is a top view of detection element 160 according to the present embodiment. Hereinafter, the specific part of the fifth embodiment will be described, mainly on a difference from the fourth embodiment. In detection element 160, width W1 of horizontal beam 126 is larger than width W2 at each of coupling portions 136 and 139 of vertical beams 123 and 124. With this configuration, it is possible to increase the bends of first detection part 149 to fourth detection part 152 when an angular velocity around the X-axis is applied. The other parts are the same as those of the fourth embodiment. Accordingly, the same components as those of the fourth embodiment are assigned with the same reference marks, and detailed description on them will be omitted.

Figure 12A:
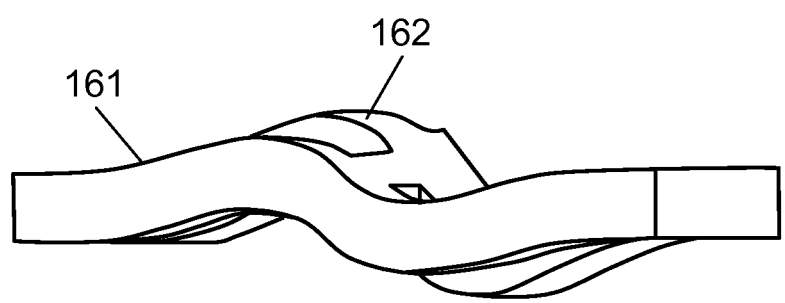
FIG. 12A is a partial side view of the detection element shown in FIG. 11.
Figure 12B:
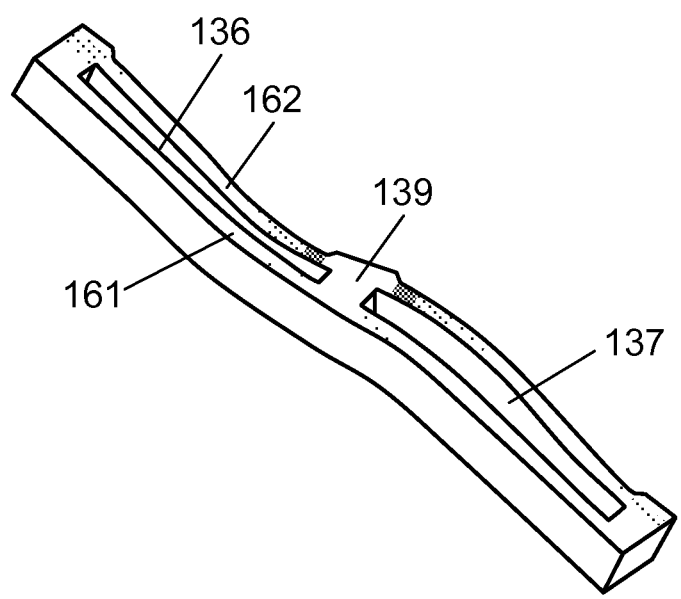
FIG. 12B is a partial perspective view of the detection element shown in FIG. 11.

FIG. 12A and FIG. 12B are a side view and a perspective view, respectively, of part T shown in FIG. 11 when an angular velocity around the X-axis is applied. Since width W1 of horizontal beam 125 is larger than width W2 at coupling portion 139 of vertical beams 124, a Coriolis force in the Z-axis direction generated when the angular velocity around the X-axis is applied concentrates on inner part 162. Therefore, as shown in FIG. 12A, inner part 162 of vertical beam 124, on which third detection part 151 and fourth detection part 152 are disposed, is bent more largely than outer part 161 of vertical beam 124. The same thing can be applied to vertical beam 123. That is, the inner part of vertical beam 123, on which first detection part 149 and second detection part 150 are disposed, bends more largely than the outer part of vertical beam 123.

FIG. 12B is a perspective view of part T, in which more largely bent portions when a specified stress is applied are indicated by thicker density of dots. Bend at inner part 162 is larger than that at outer part 161. Also, within inner part 162, bend is larger as closer to coupling portion 139. Accordingly, by forming first detection part 149 to fourth detection part 152 in the vicinity of coupling portions 136 and 139 in inner parts 162 of vertical beams 123 and 124, the sensitivity of detecting an angular velocity around the X-axis can be improved.

Further, the areas of third detection part 151 and fourth detection part 152 can be increased by making the width of inner part 162 of vertical beam 124 to be larger than the width of outer part 161. Similarly, the areas of first detection part 149 and second detection part 150 can be increased by making the width of the inner part of vertical beam 123 to be larger than the width of the outer part. Accordingly, the sensitivity of detecting an angular velocity around the X-axis can be further improved.

Figure 13:
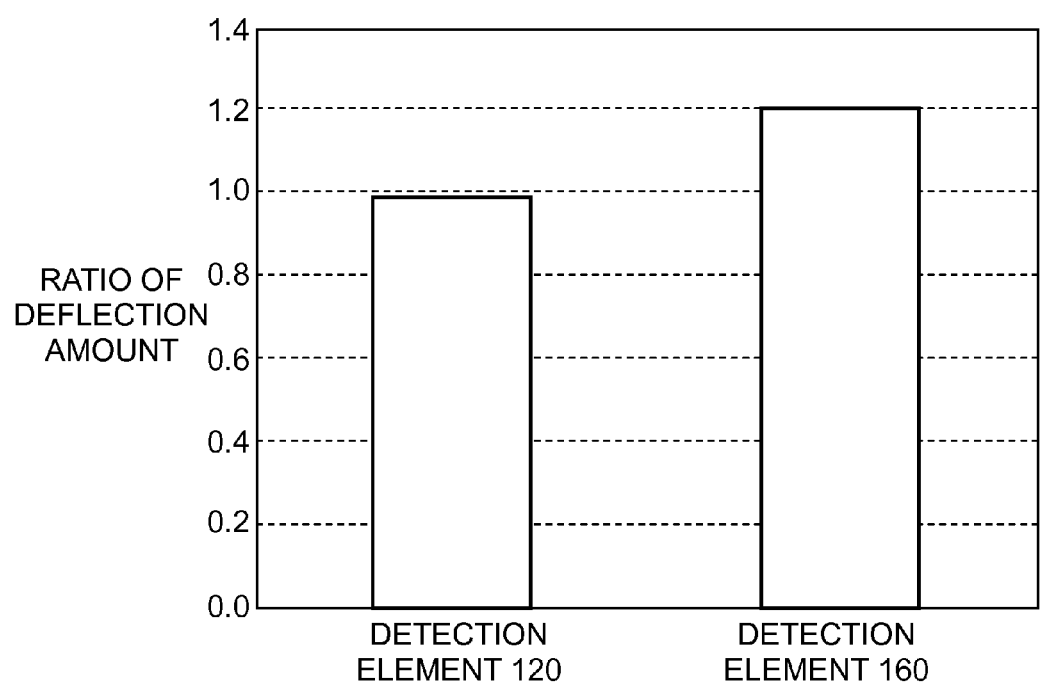
FIG. 13 is a diagram showing bending amounts in the detection elements according to the fourth and fifth embodiments.
Figure 14:
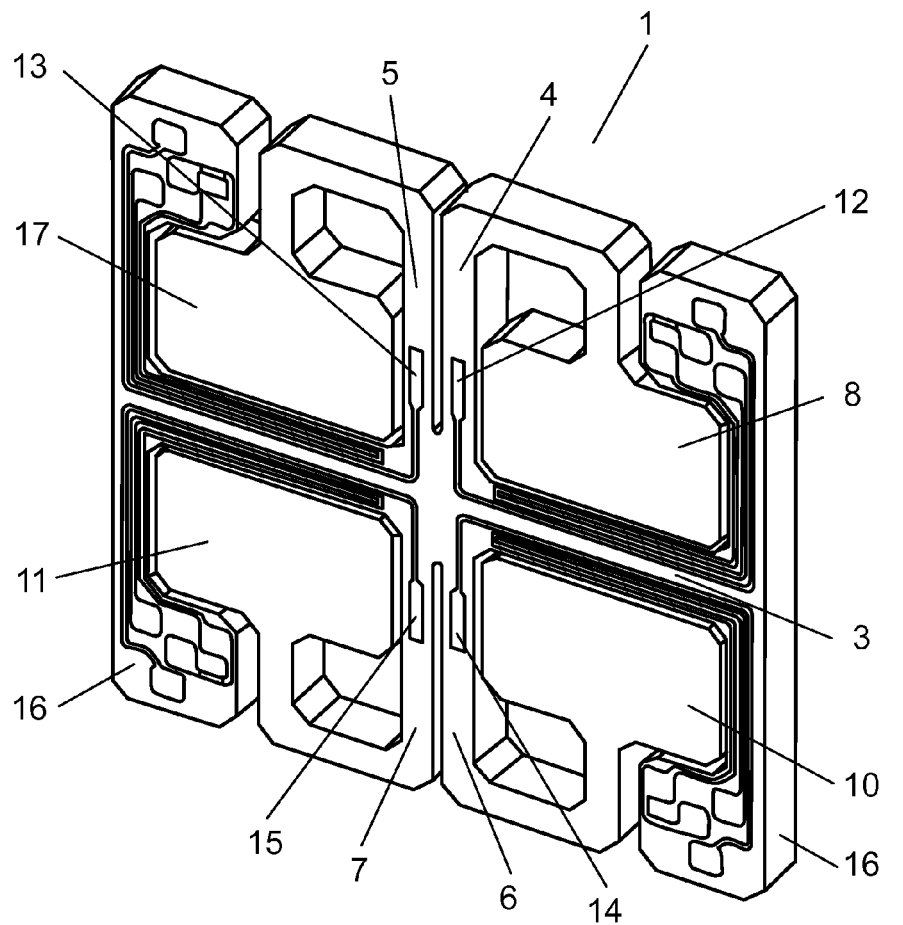
FIG. 14 is a perspective view of a conventional detection element for an angular velocity sensor.
Figure 14:
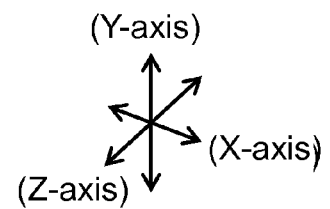

FIG. 13 shows a ratio of a bending amount in detection element 120 according to the fourth embodiment with respect to a bending amount in detection element 160 according to the present, fifth embodiment when an angular velocity around the X-axis is applied. In detection element 120, as shown in FIG. 7 and FIG. 8, the width of horizontal beam 125 is the same as the width at coupling portions 136 and 139 of vertical beams 123 and 124. In detection element 160, width W1 of horizontal beam 125 is three times as large as width W2 at coupling portions 136 and 139 of vertical beams 123 and 124.

As shown in FIG. 13, when a same magnitude of angular velocity around the X-axis is applied, detection element 160 bends 1.2 times compared to detection element 120. As can be understood, by making width W1 of horizontal beam 125 to be larger than width W2 at coupling portions 136 and 139 of vertical beams 123 and 124, the bend at the inner part, on which first detection part 149 to fourth detection part 152 are formed, can be increased, so that the sensitivity of detecting an angular velocity around the X-axis can be improved.

The configuration of the fifth embodiment may be applied to the second embodiment.

INDUSTRIAL APPLICABILITY

The detection element according to the present invention, which can suppress variations in the detection sensitivity, is useful as a detection element used in mobile terminals, vehicles, and the like.

The invention claimed is:

1. A detection element comprising:
a frame part having a first vertical beam and a second vertical beam;
a flexible part connected to the frame part and supporting a weight;
a first detection part configured to output a signal responsive to an angular velocity and disposed on the first vertical beam;
wherein the first vertical beam has a first slit, a second slit, and a first coupling portion between the first slit and the second slit,
the second vertical beam has a third slit, a fourth slit, and a second coupling portion between the third slit and the fourth slit,
the first detection part and a wiring are disposed on the first vertical beam, and
the first slit is located between the first detection part and the wiring.

2. The detection element according to claim 1,
wherein the flexible part includes:
a horizontal beam having a first end connected to a center of the first vertical beam, and a second end connected to a center of the second vertical beam; and
first to fourth arms connected to the horizontal beam.

3. The detection element according to claim 2,
wherein the horizontal beam has a width larger than a width of the first coupling portion and a width of the second coupling portion.

4. The detection element according to claim 2,
wherein the first arm and the second arm are line-symmetrical with respect to a center axis of the horizontal beam in a direction in which the horizontal beam extends between the first vertical beam and the second vertical beam,
the third arm and the fourth arm are line-symmetrical with respect to the center axis of the horizontal beam in the direction in which the horizontal beam extends between the first vertical beam and the second vertical beam,
the first arm and the third arm are line-symmetrical with respect to an orthogonal axis perpendicular to the center axis of the horizontal beam,
the first ends of the first and second arms are connected to a position closer to a center of the horizontal beam than to the first vertical beam, and
the first ends of the third and fourth arms are connected to a position closer to the center of the horizontal beam than to the second vertical beam.

5. The detection element according to claim 2,
wherein the first arm and the second arm are line-symmetrical with respect to a center axis of the horizontal beam in a direction in which the horizontal beam extends between the first vertical beam and the second vertical beam,
the third arm and the fourth arm are line-symmetrical with respect to the center axis of the horizontal beam in the direction in which the horizontal beam extends between the first vertical beam and the second vertical beam,
the first arm and the third arm are line-symmetrical with respect to an orthogonal axis perpendicular to the center axis of the horizontal beam, the first ends of the first and second arms are connected to a position closer to the first vertical beam than to a center of the horizontal beam, and the first ends of the third and fourth arms are connected to a position closer to the second vertical beam than to the center of the horizontal beam.

6. An angular velocity sensor comprising:

the detection element as defined in claim 1; and a detection circuit configured to process a signal outputted from the first detection part of the detection element.

7. The detection element according to claim 1 further comprising:

an electrode pad disposed on the frame part; and a second detection part disposed on the flexible part, wherein the wiring is connecting the electrode pad to the second detection part.

8. A detection element comprising:

a first member and a second member extending along a Y-axis direction;

a third member connected to the first member and the second member, the third member extending along an X-axis;

a fourth member connected to the third member, extending along the Y-axis between the first and second members;

a first slit and a second slit disposed in the first member, the first slit and second slit extending along the Y-axis;

a third slit and a fourth slit disposed in the second member, the third slit and fourth slit extending along the Y-axis;

a first coupling portion of the first member between the first slit and the second slit; and a second coupling portion of the second member between the third slit and the fourth slit, wherein the X-axis and Y-axis are perpendicular to each other, the first slit and the second slit are disposed to be offset from a center line along the Y-axis of the first member, and the third slit and the fourth slit are disposed to be offset from a center line along the Y-axis of the second member.

9. The detection element according to claim 8, wherein the first member is a beam, the second member is a beam, the third member is a beam, and the fourth member is an arm.

10. The detection element according to claim 8, wherein the first slit and the second slit are placed laterally relative to the center line of the first member, and the third slit and the fourth slit are placed laterally relative to the center line of the second member.

11. The detection element according to claim 8, wherein the first coupling portion and the second coupling are placed on a center line along the X-axis of the third member.

12. The detection element according to claim 8, wherein a width along the Y-axis of the first slit is longer than a width along the Y-axis of the fourth member connected to the third member.

13. The detection element according to claim 8, wherein a width along the Y-axis of the first slit is equal to a width along the Y-axis of the second slit.

14. The detection element according to claim 8, wherein a width along the Y-axis of the first coupling portion is equal to a width along the Y-axis of the second coupling portion.

15. The detection element according to claim 8, wherein a metal layer is disposed on internally from the center line of the first member.

* * * * *